United States Patent [19]

O'Hara, Jr.

[11] Patent Number: 4,578,771

[45] Date of Patent: Mar. 25, 1986

[54] DYNAMICALLY REPROGRAMMABLE ARRAY LOGIC SYSTEM

[75] Inventor: Almerin C. O'Hara, Jr., Kingston, N.Y.

[73] Assignee: International Business Machines Corporation, Armonk, N.Y.

[21] Appl. No.: 221,149

[22] Filed: Dec. 29, 1980

[51] Int. Cl.[4] ............................................. G11C 11/40
[52] U.S. Cl. .................................................. 364/716
[58] Field of Search ... 364/200 MS File, 900 MS File, 364/716, 200, 900; 340/166 R

[56] References Cited

U.S. PATENT DOCUMENTS

| | | | |
|---|---|---|---|
| 3,962,684 | 6/1976 | Caudel et al. | 364/200 |
| 3,983,538 | 9/1976 | Jones | 340/172.5 |
| 4,041,459 | 8/1977 | Horninger | 340/166 R |
| 4,044,338 | 8/1977 | Wolf | 340/900 |
| 4,056,807 | 11/1977 | Thornber | 365/195 |
| 4,354,228 | 10/1982 | Moore et al. | 364/200 |
| 4,409,499 | 10/1983 | Zapisek et al. | 364/716 |

OTHER PUBLICATIONS

H. Fleisher et al, An Introduction to Array Logic, published in IBM Journal of Research and Development, Mar. 1975, pp. 98–109.

J. C. Logue et al, Hardware Implementation of a Small System in Programmable Logic Arrays, published in IBM Journal of Research and Development, Mar. 1975, pp. 110–119.

J. W. Jones, Array Logic Macros, published in IBM Journal of Research and Development, Mar. 1975, pp. 120–126.

Primary Examiner—Gareth D. Shaw
Assistant Examiner—John G. Mills
Attorney, Agent, or Firm—Karl O. Hesse

[57] ABSTRACT

A dynamically reprogrammable logic array including an AND array and an OR array having an output register at the output of the OR array. Commands stored in a load directory specify subarrays within an array for repersonalization. In addition to specifying subarrays, the commands specify an address in load storage containing the personality to be loaded into the subarrays. The load commands stored in the load directory are selectable by a microprocessor, another logic array or by the same logic array being repersonalized.

7 Claims, 6 Drawing Figures

| SALS ADDR | NEXT | A | X | Y | X' | Y' |

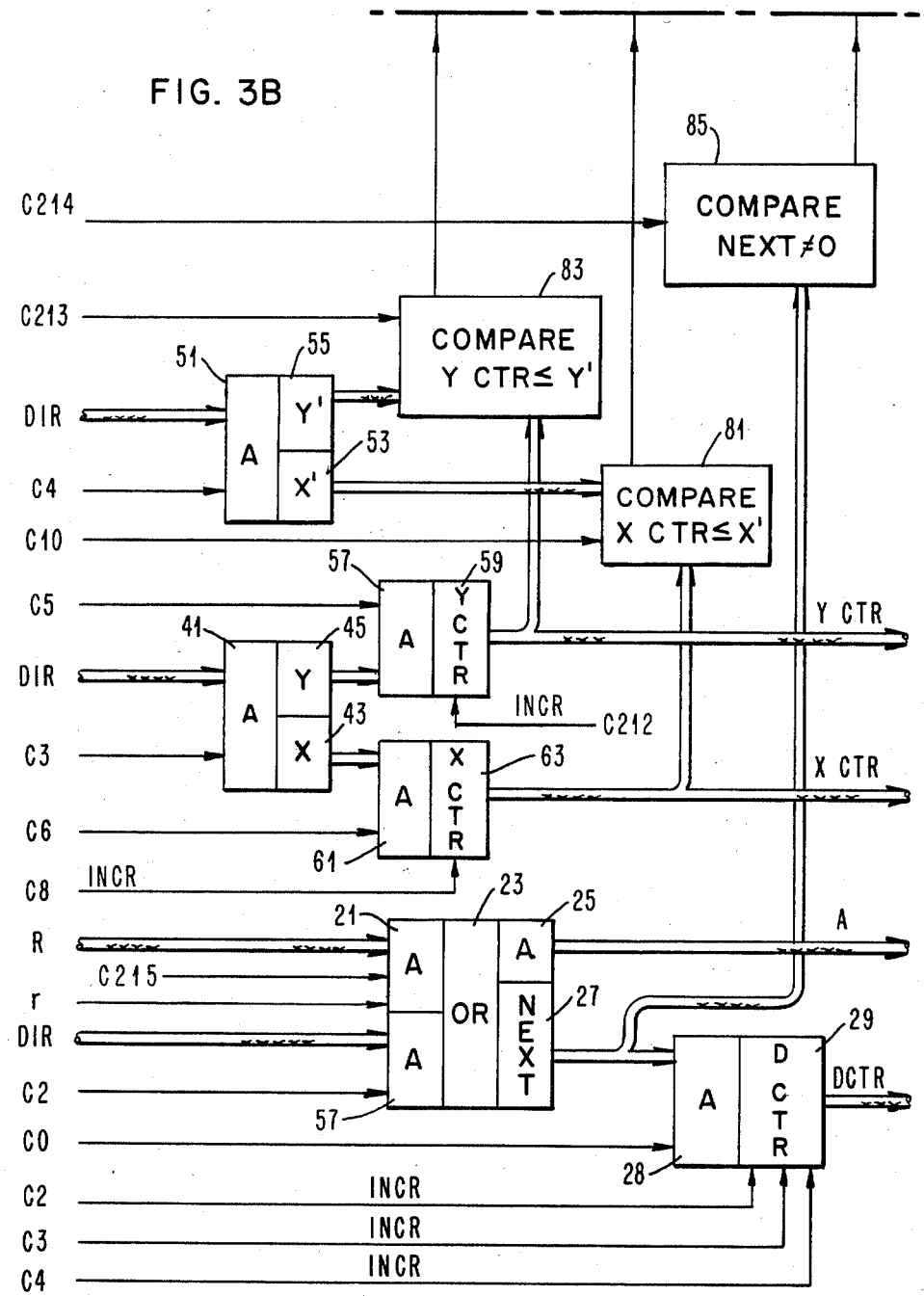

DYNAMICALLY REPROGRAMMABLE ARRAY LOGIC SYSTEM

TECHNICAL FIELD

The invention relates to a general purpose computing or logic executing apparatus implemented in reprogrammable array logic. The invention finds particular utility in the implementation of control logic and control processors for applications requiring high speed processing of substantial amounts of data and a wide variety of logic functions such as often occurs in man-machine interfaces. Examples of high speed processing include error detection and speech processing while examples of wide function flexibility include guiding responses to operator input

BACKGROUND ART

The use of programmable array logic for implementing separate random logic functions as well as functions within microcomputers is well known in the prior art. U.S. Pat. Nos. 3,983,538 and 4,044,338 are examples of array logic which can implement either random logic or sequential logic. U.S. Pat. No. 4,044,338 includes interaction with a main memory. Most of the programmed logic arrays in use at the present time are permanently programmed at the time of manufacture by selective etching of metal connections or other similar techniques. Permanently programmed programmable logic arrays offer very dense logic implementation because fewer switching devices are required.

In recent years, reprogrammable logic arrays have been manufactured using some of the techniques used for programmable read/only memories. U.S. Pat. No. 4,041,459 is an example of a programmable logic array into which a logic pattern can be electronically written and stored in the metal insulation of insulated semiconductor storage transitors comprising the switching elements of the AND array and the OR array.

Accordingly it is known in the prior art to implement various logic functions in programmable logic arrays and it has further become known to electronically modify the logic in a programmable logic array, primarily to reduce the cost of making engineering changes.

A disadvantage of present programmable logic array systems is that each logical function implemented in the AND and OR arrays requires array space, independent of its relative importance measured in terms of activity or frequency of use.

SUMMARY OF THE INVENTION

It is an object of this invention to improve cost performance of logic and processors by providing dynamic reprogramming of one or more logic arrays during execution of control functions and to improve reprogramming performance by reprogramming only those subarrays of selected arrays which require change to permit the next functions to be executed.

It is a still further object of this invention to permit the array personality for implementing those less often used functions to be stored in read/only storage or read/write storage, and loaded into the reprogrammable logic array only when needed.

It is an even still further object of this invention to avoid the decreasing area efficiency due to increasing sparsity associated with large arrays by permitting smaller arrays to execute all of the functions for which a large array would be required if all of the personality for all of the functions were permanently stored in the array.

An additional object of the invention is to provide means for specifying an array to be repersonalized and to specify an address in a load memory for repersonalizing the logic of at least part of the array.

These and other objects are accomplished by providing a reprogrammable logic array including an AND array and an OR array having an output register at the output of the OR array. Commands stored in a load directory specify subarrays within an array for repersonalization. In addition to specifying subarrays, the commands specify an address in load storage containing the personality to be loaded into the subarrays. The load commands stored in the load directory are selectable by a microprocessor, another logic array or by the same logic array being repersonalized. Likewise, the load directory and the load store are not simultaneously accessed and therefore are capable of being implemented as part of a general purpose memory which operates with the logic array to store data being processed by the reprogrammable logic array.

BRIEF DESCRIPTION OF THE DRAWINGS

FIG. 2 shows the field definitions of the commands in the subarray load directory.

FIG. 3, 3A and 3B show detailed logic for implementing the personality load control logic 8 of FIG. 1.

BEST MODE FOR CARRYING OUT THE INVENTION

Figure 1:
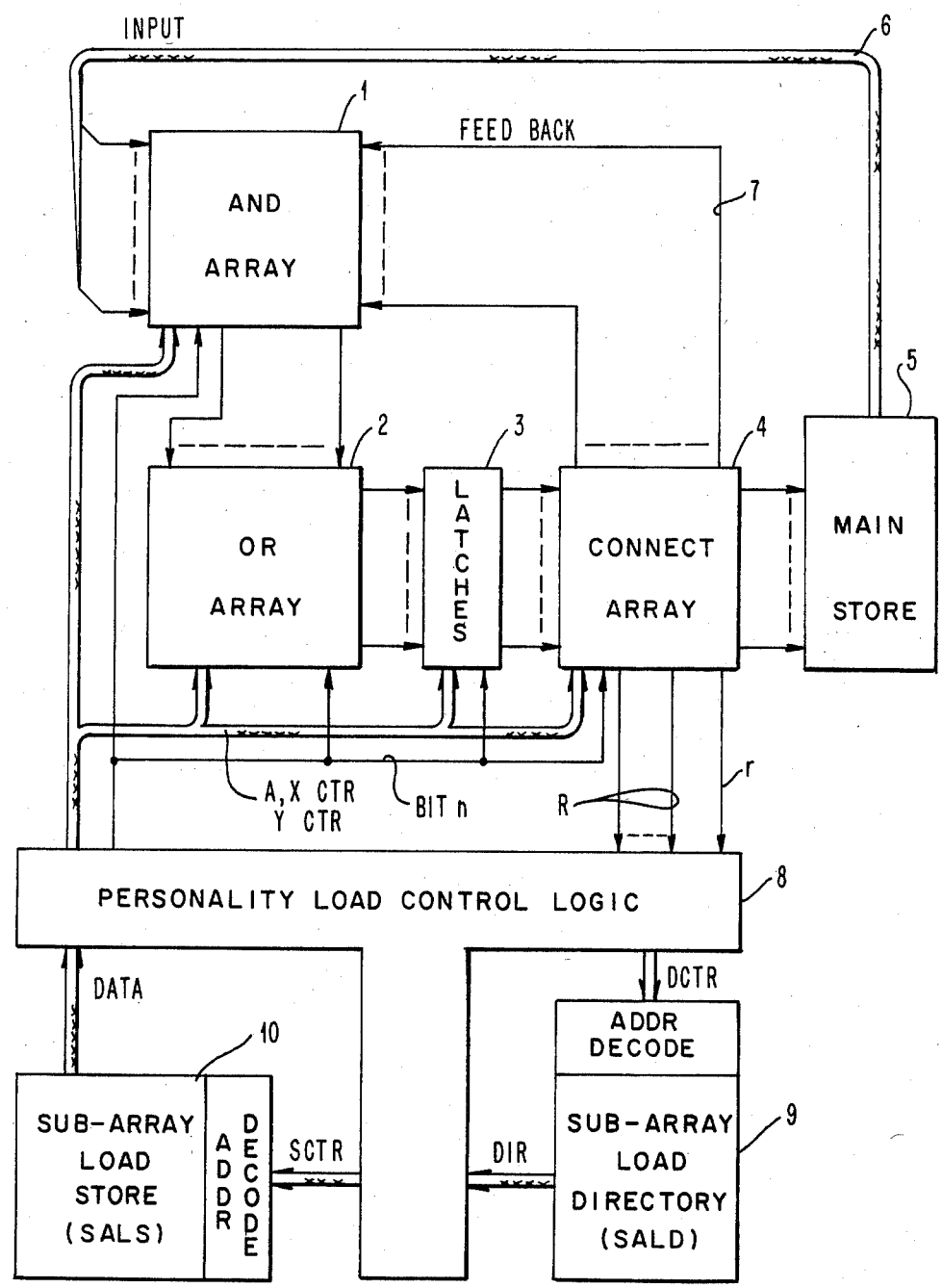
FIG. 1 shows a system diagram.

Referring to FIG. 1, a system diagram is set forth showing the major component parts of the invention and their relationship to each other. AND array 1 as well as OR array 2 can be similar to the arrays set forth U.S. Pat. No. 4,041,459. These arrays are arrays of metal nitride oxide semiconductor switching devices. Each switching device can accept an electrical charge impressed by write voltages to thereafter constitute a gate input.

Latches 3 connected to the output of OR array 2 are also in effect a one dimensional array of storage elements. Each latch 3 is set if its respective OR array input line has a binary 1 signal and is reset if its respective OR array input line has a binary zero signal. The outputs of latches 3 are connected to connect array 4.

Figure 4:
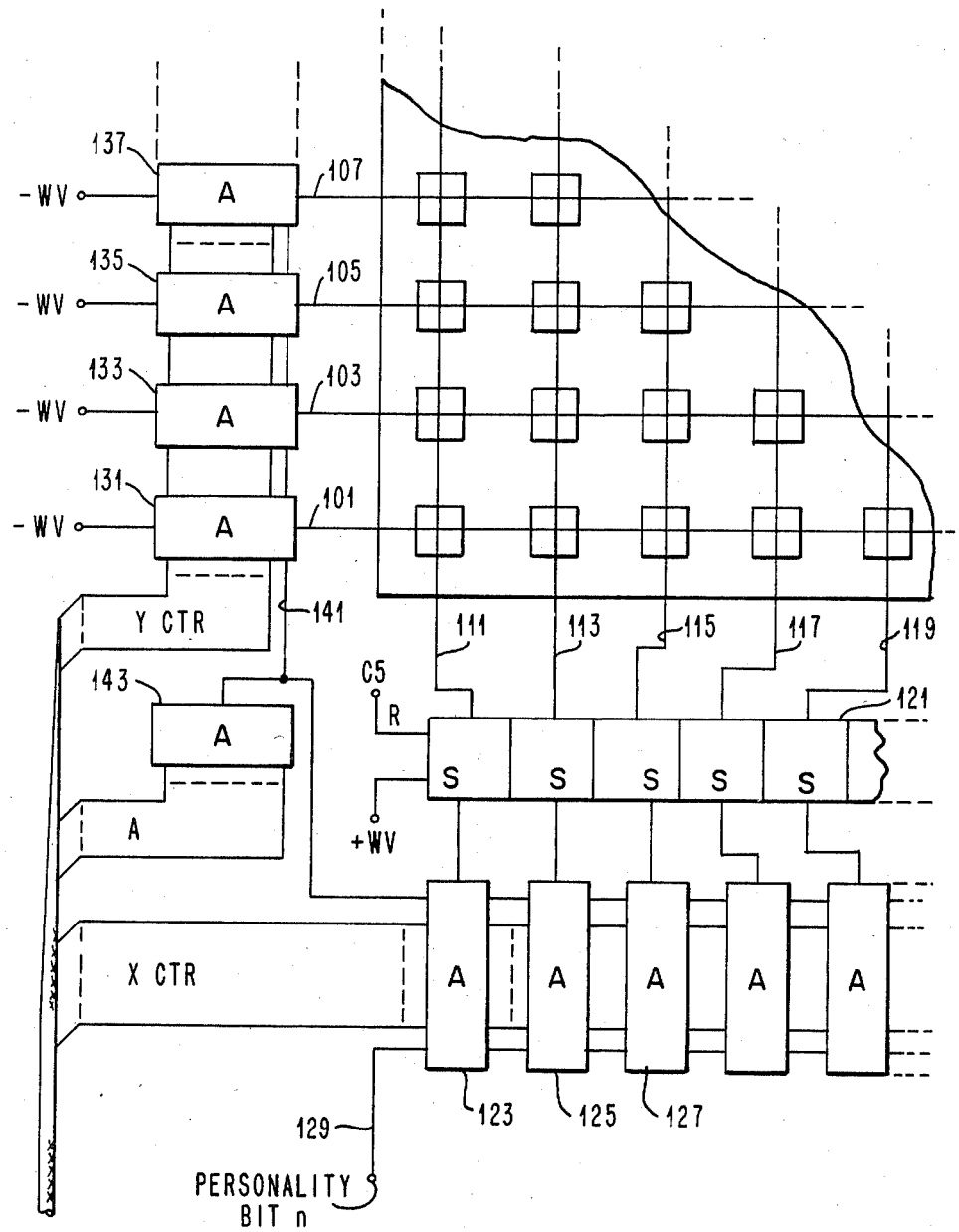
FIG. 4 shows example gates for repersonalizing an example array.

Although latches 3 are in effect a single dimension array, latches 3 are also a simple register which can be written without the need for the long high voltage write pulses described with respect to FIG. 4. In other words, when writing latches 3, the latches are set much as the stages of register 121 of FIG. 4 are set.

Connect array 4 may be permanently wired connections of the outputs of latches 3 to the inputs to main store 5 and to feedback lines to AND array 1. It is preferable if connect array 4 is also a reprogrammable array in the nature of a crosspoint switch. Some of the outputs from connect array 4 to main store 5 are address and control outputs causing main store 5 to store other outputs from connect array 4 into the addressed storage locations. In addition to providing address inputs and data inputs to main store 5 and feedback connections 7 to AND array 1, connect array 4 has a smaller number of lines constituting the reprogram R bus connected to the personality load control logic 8. It is the R outputs of connect array 4 that stimulate control logic 8 to repersonalize any of the arrays 1, 2, 3, or 4.

As part of the repersonalization of the arrays 1 and 2, it is often desirable to save the contents of latches 3 which constitute the present state of the execution of the logic of arrays 1 and 2. Likewise it is desirable to preload latches 3 with a starting logic bit pattern. Saving and restoring latches 3 permits the reprogrammable array system to respond to interrupts or other events. At completion of processing by other logic as required by the interrupting event, the original logic can resume execution, using the restored content of latches 3, after the original logic has been restored in arrays 1 and 2.

Figures 2, 3A:
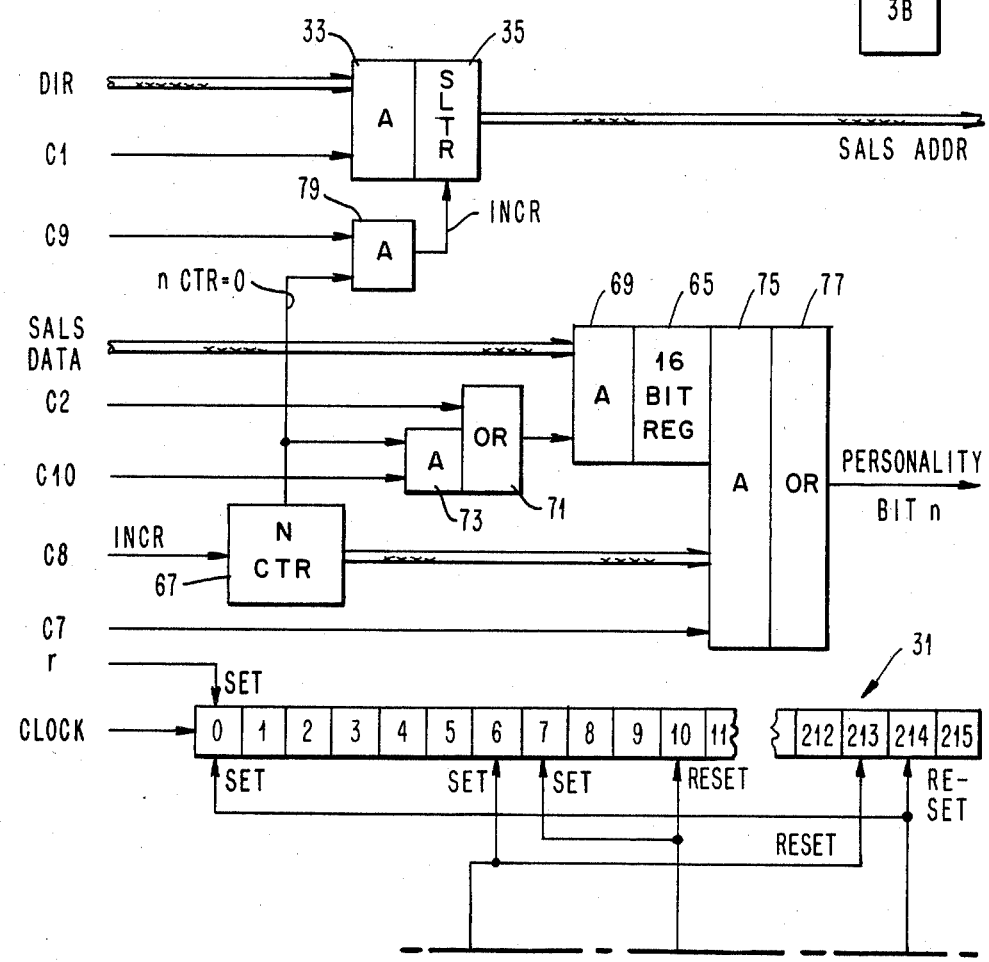

Because latches 3 are a single dimension array, the Y and Y' fields of the load command of FIG. 2 need not be used to specify a subarray and become available for use as a save address in main store 5. The array field A of FIG. 2 can be used to specify whether latches 3 are to be saved or restored. For example, specifying array field contents 0011 restores latches 3 through load store 10, whereas specifying an array field of 0101 saves latches 3 in main store 5. Main store 5 and load store 10 are in fact the same physical memory as described below.

It will also be recognized by those skilled in the art of digital logic design that latches 3 can be loaded in at least three different ways. One way is to load latches 3 from main store 5 through arrays 1 and 2 during the first few logic execution cycles of the array by logic loaded into the array during repersonalization. A better way is to provide a direct load path external to arrays 1 and 2. Although shown as separate to more easily describe the invention, FIG. 1 contemplates that main store 5, load directory 9, and load store 10 be in fact the same physical memory. The input and output busses to stores 5, 9, and 10 are therefore in reality, connected to the same address register and data register of the physical memory by multiplexing gates, not shown, preferably controlled by a clock counter 31 within control logic 8, to be described later in detail. Since store 10 and store 5 are physically the same memory, the logic bit pattern to be preloaded into register 3 can be brought in through control logic 8 by merely specifying a predetermined load store address to reach into a main store location. A third way of preloading latches 3 would be to provide a bidirectional path through connect array 4. This third way complicates array 4 and is not preferred.

Personality load control logic 8 has a subarray load directory address counter (DCTR) output to the subarray load directory 9. As stated above, load directory 9 is an ordinary memory storing sixteen bit words. The output of load directory 9 is accordingly 2 bytes of information on a sixteen wire bus labeled DIR. Since each command entry in the subarray load directory 9 is eight bytes, the load directory must be accessed four times to retrieve each subarray load command. Personality load control logic 8 receives each sixteen bit word in sequence and stores the information in latches or registers within control logic 8. Part of the information received from load directory 9 is a subarray load store address which is provided to subarray load store 10 from a counter (SCTR) 35 for accessing personality data stored in load store 10. Personality load control logic 8 uses the array identification field (A) and the subarray identifying coordinate fields (X, Y, X', Y') to store data from the subarray load store 10 into a subarray of the selected array 1, 2, 3, or 4.

Referring now to FIG. 2, it will be seen that the subarray load store (SALS) address is the first two bytes or sixteen bit word received by control logic 8 from subarray load directory 9. The SALS address is stored in a counter (SCTR) 35, the outputs of which address subarray load store 10. The sixteen bit SALS address is therefore adequate to address the single physical memory comprising stores 5, 9, and 10.

In order to avoid complicating the explanation of the invention, input/output has been mapped into the address space of main store 5. Accordingly, input signals and interrupts will be received on bus 6 and output signals will be provided through connect array 4.

The third and fourth byte from load directory 9 to control logic 8 comprise a twelve bit field (NEXT) identifying the next subarray load directory address which may be chained to this load directory command and a four bit field (A) identifying the array whose logic is to be reprogrammed. Inasmuch as four bits are provided for array identification, up to sixteen different arrays can be reprogrammed. Thus, control logic 8 and subarray load directory 9 and subarray load store 10 can control the reprogramming of several reprogrammable logic array systems for performing different logic functions simultaneously or merely effecting system bus connections using an array like connect array 4. In this way two or more reprogrammable logic arrays can implement a logic system. One array may be executing while the other is being repersonalized to provide uninterrupted service. The twelve bit NEXT field is too short to directly access the physical memory comprising stores 5, 9, and 10. Therefore these twelve bits are used as low order bits and predetermined states such as all zero are assigned as the four high order address bits. Thus load directory 9 can occupy up to the first four thousand ninety six bytes of the physical memory.

The fifth and sixth byte from subarray load directory 9 are the X and Y starting coordinates of the subarray within the identified array to be reprogrammed. The seventh and eighth bytes are the X' and Y' or ending coordinates of the subarray of the identified array to be reprogrammed.

FIG. 4 is provided to more clearly set forth an example of how the subarray coordinate values accomplish the reprogramming of an array with new personality bits. The array to be reprogrammed comprises a plurality of horizontal rows 101, 103, 105, and 107. Intersecting each of these horizontal lines are a plurality of vertical columns 111, 113, 115, 117, and 119. At the intersection of each line and column is a metal nitride oxide semiconductor (MNOS) switch capable of storing a charge impressed by write voltage WV which will be appropriately connected to the horizontal lines and vertical columns under control of control logic 8. Further details of reprogrammable arrays per se appear in U.S. Pat. No. 4,041,459.

Because subarray load store 10 like subarray load directory 9 is a straightforward semiconductor memory which may be a read/only or a read/write memory having sixteen bit words, each sixteen bit word must somehow be provided to the array of FIG. 4. A straightforward approach is to permit each sixteen bit word to be entered horizontally line by line beginning with the array cell identified by the X and Y coordinate values.

Using this straightforward approach in FIG. 4, personality information is written into the array line by line, and since a subarray line may be longer than sixteen bits, a register 121 is provided for storing each personality bit of a line prior to writing. Each latch of register 121 is set by AND gates 123, 125, 127 and so forth. Likewise, each line 101 through 107 is activated by an AND gate 131, 133, 135, and 137 respectively. Each of the AND gates 123-127 and 131-137 has an array input line 141 from AND gate 143. AND gate 143 has four inputs from the A register which identify the array to be reprogrammed. If the bit pattern on the four A wires matches the wired gate configuration of AND gate 143, a signal is provided on line 141 to condition all of the line and column AND gates for this array. In addition to being connected to AND gate 143, each of gates 123, 125, 127 is connected to the eight wires from the X counter XCTR. The X counter then controls each of the gates to pass the personality bit on input wire 129 to a respective latch of register 121 in sequence as the X counter steps from a value of X to a value of X' defining a row of the subarray. Likewise, an AND gate of gates 131 through 137 is conditioned by the bit pattern on the eight wires from the Y counter (YCTR) to select one horizontal row. In this way, the write voltage WV is simultaneously applied to all of the cells at the intersection of a horizontal row and each of the selected vertical columns of the subarray identified by X, Y, and X', Y'. After the write voltage has been applied to one horizontal row for a predetermined period to insure reliable charge storage, the Y counter is incremented to the next horizontal row and the X counter again steps from X through X' to set the latches of register 121 with a new personality row. At the same time that the Y counter was incremented, register 121 is reset by a clock signal C6 thereby removing the bit pattern of the previous row.

OPERATION OF THE INVENTION

Figure 3:
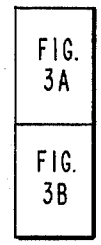

Referring now to FIG. 3, details of the control logic of personality load control logic 8 will be described as part of a description of the operation of the invention. The following table is an outline of the steps of reprogramming all or part of one or more arrays.

TABLE 1

| CLOCK CYCLE | FUNCTIONS PERFORMED |
|---|---|
| C215 | ENABLE FIRST LOAD COMMAND ADDRESS |
| C0 | ACCESS LOAD COMMAND FROM NEXT REG |
| C1 | LOAD SCTR 35; |
| C2 | INCR DCTR; LOAD NEXT REG 27; LOAD A REG 25 |
| C3 | INCR DCTR; LOAD X REG 43; LOAD Y REG 45 |
| C4 | INCR DCTR; LOAD X' REG 53; LOAD Y' REG 55 |
| C5 | MOVE Y TO YCTR 59; LOAD REG 65 |
| C6 | MOVE X TO XCTR 63; RESET REG 121 |
| C7 | GATE PERSONALITY BIT TO ARRAY |
| C8 | INCR BIT COUNTER 67; INCR XCTR |
| C9 | IF LAST BIT OF WORD INCR SCTR 35 |
| C10 | IF LAST BIT LOAD REG 65, IF X≦X' GO TO C7 |
| . | |
| . | |
| . | (ROW CELL WRITE TIME) |
| . | |
| . | |
| C212 | INCR YCTR 59 |
| C213 | IF YCTR≦Y' GO TO C6 |
| C214 | IF NEXT ≠ 0 GO TO C0 |
| C215 | RETURN CONTROL TO ARRAY FOR LOGIC EXECUTION |

AND gate 21 in FIG. 3B receives the R input identifying a subarray load directory command for reprogramming a function into one of the arrays. When the control logic of personality load control logic 8 is in its normal reset state, clock counter 31 in FIG. 3A is stopped at clock cycle C215. In this state, the address and data registers of the physical memory comprising stores 5, 9, and 10 are connected to connect array 4 and also to bus 6 as shown in FIG. 1. When clock cycle C215 is active and a signal is received on line r from latches 3, via connect array 4 the bit pattern on bus R, also from latches 3, is gated through AND gate 21 via OR gate 23 to registers 25 and 27. The signal on line r also sets the first stage of clock counter 31 in FIG. 3A which is thereafter incremented or shifted by a clock oscillator. For example, in FIG. 3A the signal on r sets latch position zero of clock counter 31. In this state, the address and data registers of the physical memory comprising stores 5, 9, and 10 are connected to DCTR, and DIR, respectively until the load command is fully read from memory at clock cycle C4. The C0 output of clock counter 31 activates gate 28 in FIG. 3B to pass the contents of register 27 to subarray load directory address counter (DCTR) 29. The contents of DCTR access a storage location in the subarray load directory 9.

Each subsequent clock cycle advances the count in clock counter 31. At clock output time C1, AND gate 33 in FIG. 3A receives the 2 byte subarray load storage address on the DIR bus from the subarray load directory and stores it in the load store counter (SCTR) 35. At the end of C1 as clock counter 31 increments to C2, C2 increments the directory address counter DCTR 29 in FIG. 3B to access the third and fourth bytes of the command in load directory 9. The third and fourth bytes are the twelve bit NEXT field and the four bit array field A. These fields are stored in the NEXT register 27 and A register 25 by AND gate 57 during clock time C2. As the clock counter 31 increments from C2 to C3, the directory counter DCTR 29 is again incremented in preparation for receiving the fifth and sixth bytes which are the X and Y coordinates of the subarray to be loaded. The X and Y bytes are received on the DIR bus and gated through AND gates 41 to the X and Y registers 43 and 45 for storage. C4 increments directory counter 29 to address the seventh and eighth bytes of the reprogram command. At clock time C4, the X' and Y' coordinates of the subarray to be loaded are gated from the DIR bus by AND gate 51 to registers 53 and 55 respectively.

Having provided Registers 25, 27, 29, 35, 43, 45, 53, and 55, for storing the eight bytes comprising the subarray load command, the remaining logic of personality load control logic 8 for accomplishing the repersonalization will now be described.

At clock counter states C5 through C214, the address and data registers of the physical memory comprising stores 5, 9, and 10, are connected to SCTR and DATA respectively AND gates 57, in FIG. 3B, each having an input connected to clock counter C5 and an input connected to a stage of Y Register 45 gate the Y coordinate from Register 45 into Y counter (YCTR) 59. Likewise, AND gates 61 have an input connected to clock counter stage C6 and another input connected to a stage of X coordinate register 43 for gating the contents of X Register 43 into X counter (XCTR) 63. X and Y counters 63 and 59 respectively control the transfer of personality bits from subarray load store 10 to the array to be repersonalized The bits are transferred through a sixteen bit register 65 in FIG. 3A and are transferred out of register 65 under control of a bit counter (nCTR) 67. Toward this end the SALS data bus from load store 10 is connected to inputs of AND gates 69. The outputs of AND gates 69 are connected to the stages of register 65. A control input to each of AND gates 69 is connected to the output of OR gate 71. Or gate 71 in turn has an input from the clock counter stage C5 and an input from AND gate 73. Clock counter state C5 loads the initial personality word into register 65. AND gate 73 has inputs connected to the zero output of bit counter nCTR 67 and to clock counter stage C10. The outputs of Register 65 are connected to AND gates 75, each of which have a second input connected to a different stage of bit counter nCTR 67 and a third input connected to clock counter stage C7. The output of each of AND gates 75 is connected to a different input of OR gate 77. Or gate 77 thus provides each personality bit in sequence to the array being repersonalized under control of nCTR 67.

It will be appreciated by logic designers that it is wasteful of load storage to provide for loading a subarray with all zeroes or all ones. Accordingly a simple set of logic gates can be provided to generate only binary zero bits to register 121 when the SCTR 35 has a zero address. These gates would also inhibit incrementing SCTR 35. Likewise binary one bits would be generated by an SCTR address of one.

After each personality bit has been stored in the array being repersonalized, the X counter XCTR 63 and bit counter nCTR 67 are incremented by clock counter stage C8. At clock time C10 the contents of XCTR 63 are compared with the contents of X' register 53 in compare 81. The output of compare 81 is connected to reset clock counter stage C10 and to set clock counter stage C7 if the contents of the X counter is less than or equal to the contents of X' register 53. In this way clock counter 31 is cycled from 7 through 10 repeatedly loading personality bits into Register 121 of FIG. 4 until Register 121 has been loaded from X through X'.

The subarray being reprogrammed may be wider than sixteen bits. When nCTR 67 reaches a count of fifteen, it turns over to a count of zero. Gate 79 responds to the zero count in nCTR 67 to increment the load store counter SCTR 35. Incrementing occurs after all sixteen bits have been transferred from Register 65 to the array. Toward this end AND gate 79 has an output connected to the increment input of SCTR 35. The two inputs to AND gate 79 are connected to the clock time stage C9 and to the zero count output of nCTR 67. Incrementing load store counter 35, of course, makes the next sixteen bits of personality available at the SALS data bus for storage into Register 65 at clock time C10. The first or zero order bit from register 65 is then gated to register 121 at the next C7 time and so forth.

Similarly, compare circuit 83 has inputs from Y counter YCTR 59 and Y' register 55 to provide an output when YCTR 59 is less than or equal to Y' at clock count C213. The control input to compare 53 is, therefore, connected to clock counter stage C213. The outputs of compare 83 are connected to set clock counter stage C6 and reset clock counter stage C213. Compare 83 causes clock counter 31 to return to a count of six permitting AND gate 61 to reload X counter 63 with the starting X coordinate in Register 43. Clock C6 also resets register 121 of FIG. 4. Y counter 59 is incremented at each clock C212.

After the Y counter has been incremented from Y through Y' all of the new personality bits have been loaded into the selected array and compare 83 does not cause clock counter 31 to loop but allows clock counter 31 to generate clock cycle C214.

Although the subarrays of the invention have been described in terms of a start coordinate and an end coordinate, it will be clear to those skilled in digital logic design that other subarray definition methods could be used. For example, an array such as AND array 1 could be divided into a number of arrays of predetermined size and location and referred to by the array address field of FIG. 2.

A compare circuit 85 in FIG. 3B is provided to compare the contents of the NEXT field register 27 with zero and provide an output which is connected to reset clock counter stage C214 and again set clock counter stage C0 to load a new subarray with new personality bits as specified by a load command stored in the subarray load directory specified by the contents of the NEXT register 27. Accordingly, the control input to compare circuit 85 is connected to the clock counter stage C214. If compare 85 produces no output at clock cycle C214, the clock counter 31 will advance to, and terminate at C215 which is its normal reset state. Clock cycle C215 is provided to the normal array controls as an oscillator gating control which allows the logic arrays to resume normal logic execution after the personality bits have been rewritten.

From the foregoing description of a preferred embodiment, it can be seen that the objects of the invention are efficiently achieved.

I claim:

1. In a system including a reprogrammable logic array of the type having an AND array and an OR array for performing a sequence of complex logical functions the improvement comprising;
 a load store for storing the logic personalities respectively representative of a plurality of functions to be executed by said reprogrammable logic array;
 accessing means responsive to a load command for accessing the logic personality of a function stored in said load store;
 addressing means for addressing said reprogrammable logic array; and
 transfer means connected to said load store and connected to said reprogrammable logic array for reading said accessed logic personality in said load store and writing said accessed logic personality into said reprogrammable logic array;
 whereby a reprogrammable logic array which has a first personality for executing a first function is dynamically repersonalized with a second personality for executing a second function so as to enable the reprogrammable logic array to perform a transaction requiring both functions without requiring that the reprogrammable logic array be large enough to store the personality for all of the functions that it may have to execute.

2. The system of claim 1 further comprising:
 an output of said reprogrammable logic array being operatively connected to said accessing means, to said addressing means, and to said transfer means for providing said load command in response to logic executing in said reprogrammable logic array.

3. The system of claim 1 further comprising:
a load directory connected to said accessing means and connected to said addressing means for storing a plurality of said load commands, each load command having a load store address field for use by said accessing means in accessing said load store and an array address field for use by said addressing means in addressing a subarray of said reprogrammable logic array.

4. The system of claim 3 wherein said trnasfer means further comprises:
reading means for reading words of personality bits from said load store and writing means for writing said bits into said subarray as specified by start and end coordinate addresses of one of said load commands.

5. The system of claim 4 further comprising:
timing means for sequencing the transfer of said personality bits from said load store to said reprogrammable logic array and extending the time of writing said bits into said reprogrammable array.

6. The method of operating a reprogrammable logic array to execute a plurality of functions, the logic personality of some of said functions being stored external to said reprogrammable logic array, comprising the steps of:
operating said reprogrammable logic array to execute a function;
accessing a plurality of memory locations in a load store, said memory locations containing the personality bits of the logic of another function;
addressing a subarray of said reprogrammable logic array;
reading said personality bits of said logic of another function in said accessed plurality of memory locations;
writing said personality bits of said logic of another function into said subarray to dynamically re-personalize at least part of said reprogrammable logic array;
operating said reprogrammable logic array to execute said another function;
whereby a reprogrammable logic array may be operated so as to execute a number of complex functions without the need for it to be so large as to be able to simultaneously contain all of the personality of all of said functions.

7. In the method of claim 6, preceding the step of accessing:
operating the logic of said reprogrammable logic array to address a load directory store containing a plurlaity of array load commands for selecting an array load command, said array load command specifying said memory locations containing said personality bits of said logic of another function and specifying the address of said subarray wherein said personality bits of said logic of another function are to be transferred.

* * * * *